(12) United States Patent
Ishizaki et al.

(10) Patent No.: US 7,786,726 B2
(45) Date of Patent: Aug. 31, 2010

(54) SENSOR

(75) Inventors: Yoichi Ishizaki, Aichi (JP); Katsuya Kogiso, Aichi (JP); Toru Minagawa, Aichi (JP); Fumihiro Suzuki, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 1065 days.

(21) Appl. No.: 11/497,559

(22) Filed: Aug. 1, 2006

(65) Prior Publication Data

US 2007/0030000 A1 Feb. 8, 2007

(30) Foreign Application Priority Data

Aug. 5, 2005 (JP) ............... 2005-228847

(51) Int. Cl.
*G01B 7/30* (2006.01)
*G01R 33/09* (2006.01)

(52) U.S. Cl. .................. 324/207.25; 324/249; 324/252

(58) Field of Classification Search ............ 324/207.21, 324/207.25, 249, 252; 428/692.1, 693.1; 257/421–427; 365/7–9; 73/514.31, 514.39
See application file for complete search history.

(56) References Cited

U.S. PATENT DOCUMENTS

| | | | |
|---|---|---|---|
| 4,810,965 A | | 3/1989 | Fujiwara et al. |
| 5,667,879 A | * | 9/1997 | Haji-Sheikh ............... 428/209 |
| 6,692,847 B2 | | 2/2004 | Shirasaki et al. |
| 6,904,669 B2 | * | 6/2005 | Sato et al. ................ 29/603.1 |
| 2004/0239321 A1 | * | 12/2004 | Kobayashi et al. ......... 324/249 |
| 2005/0194651 A1 | * | 9/2005 | Ohashi ..................... 257/415 |
| 2006/0164204 A1 | | 7/2006 | Nishiwaki et al. |

FOREIGN PATENT DOCUMENTS

| | | |
|---|---|---|
| EP | 1 221 622 A2 | 7/2002 |
| JP | 62-063811 | 3/1987 |
| JP | 2-103284 | 8/1990 |
| JP | 05-034224 | 2/1993 |
| JP | 2001-119083 | 4/2001 |
| JP | 2002-107433 | 4/2002 |
| JP | 2002-277281 | 9/2002 |
| WO | WO 2004/025745 A1 | 3/2004 |

* cited by examiner

*Primary Examiner*—Bot L LeDynh
(74) *Attorney, Agent, or Firm*—Patterson Thuente Christensen Pedersen, P.A.

(57) ABSTRACT

A magnetic sensor that is inexpensive and suppresses changes in offset voltage caused by wear. The magnetic sensor includes magnetoresistance elements having electrical resistances that change in accordance with magnetism changes. The magnetic sensor detects magnetism based on changes in the electrical resistances. The magnetoresistance elements are covered by a protective film. Part of the protective film is etched and eliminated to form a recess.

13 Claims, 5 Drawing Sheets

SENSOR

BACKGROUND OF THE INVENTION

The present invention relates to a sensor for detecting a change in a physical property.

In an automobile, a magnetic sensor is used as a steering wheel angle sensor to detect the rotational angle of a steering wheel.

Referring to FIG. 3, a magnetic sensor 1 includes four magnetoresistance elements 31 to 34, which form a Wheatstone bridge. A voltage difference is produced between node N1 of the magnetoresistance elements 31 and 32 and node N2 of the magnetoresistance elements 33 and 34. If the voltage difference between nodes N1 and N2 (difference between median potentials E1 and E2 of the bridge, or offset voltage E12) is closer to 0 V in a state in which the magnetic field of the magnetic sensor 1 extends in a predetermined direction, the magnetic sensor 1 would have a higher capacity. More specifically, when R1, R2, R3, and R4 respectively represent the electrical resistances of the magnetoresistance elements 31, 32, 33, and 34, it is preferred that the equation of R1×R4=R2×R3 be satisfied.

For the offset voltage E12 to be closer to 0 V, that is, for the above equation to be satisfied, the magnetoresistance elements 31 to 34 of the magnetic sensor 1 has predetermined patterns so that the electrical resistances R1 to R4 become equal to one another. Accordingly, the magnetoresistance elements 31 to 34 are formed by etching a magnetoresistance element formation film in accordance with the predetermined patterns. However, the accuracy in film formation and etching affects, and causes differences, in the electrical resistances R1 to R4 of the magnetoresistance elements 31 to 34. Furthermore, it is difficult for the above equation to be satisfied just by improving these accuracies.

Accordingly, a trimming process for finely adjusting the electrical resistances R1 to R4 by trimming parts of the magnetoresistance elements 31 to 34 has been proposed in the prior art (refer to, for example, Japanese Laid-Open Patent Publication No. 05-034224).

However, even when performing the trimming process to satisfy the above relationship, wear starts to progress at different rates in the magnetoresistance elements 31 to 34 immediately after the trimming process. Thus, as time elapses, the Wheatstone bridge becomes imbalanced. As a result, the offset voltage E12 changes from 0 V soon after the trimming process to a level that affects the capacity of the magnetic sensor 1. Such a change cannot be ignored.

Accordingly, prior to the trimming process, the magnetoresistance elements 31 to 34 may be irradiated by a laser beam and heated to physically stabilize the magnetoresistance elements 31 to 34. However, when a process using a laser beam (heat treatment process) is performed in addition to the trimming process, a device for laser beam emission becomes necessary. This raises the manufacturing cost of the magnetic sensor 1.

SUMMARY OF THE INVENTION

The present invention provides an inexpensive sensor for suppressing changes in the offset voltage that would be caused by wear.

One aspect of the present invention is a sensor for detecting a change in a physical property. The sensor includes a plurality of sensor elements, each having an electrical resistance that varies in accordance with a change in a physical property. A protective film covers the sensor elements. An etched portion is formed in at least part of the protective film.

A further aspect of the present invention is a magnetic sensor for detecting rotational angle of a steering wheel. The magnetic sensor includes a substrate. An insulative film is formed on the substrate. A plurality of sensor elements are formed on the insulative film. Each of the sensor elements has an electrical resistance that varies in accordance with a magnetism change. A protective film covers the sensor elements. A recess is formed in the protective film near each of the sensor elements without exposing the sensor elements from the protective film.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A magnetic sensor 1 according to a preferred embodiment of the present invention will now be discussed. The magnetic sensor 1 is used for a steering wheel angle sensor in an automobile.

Figure 1:
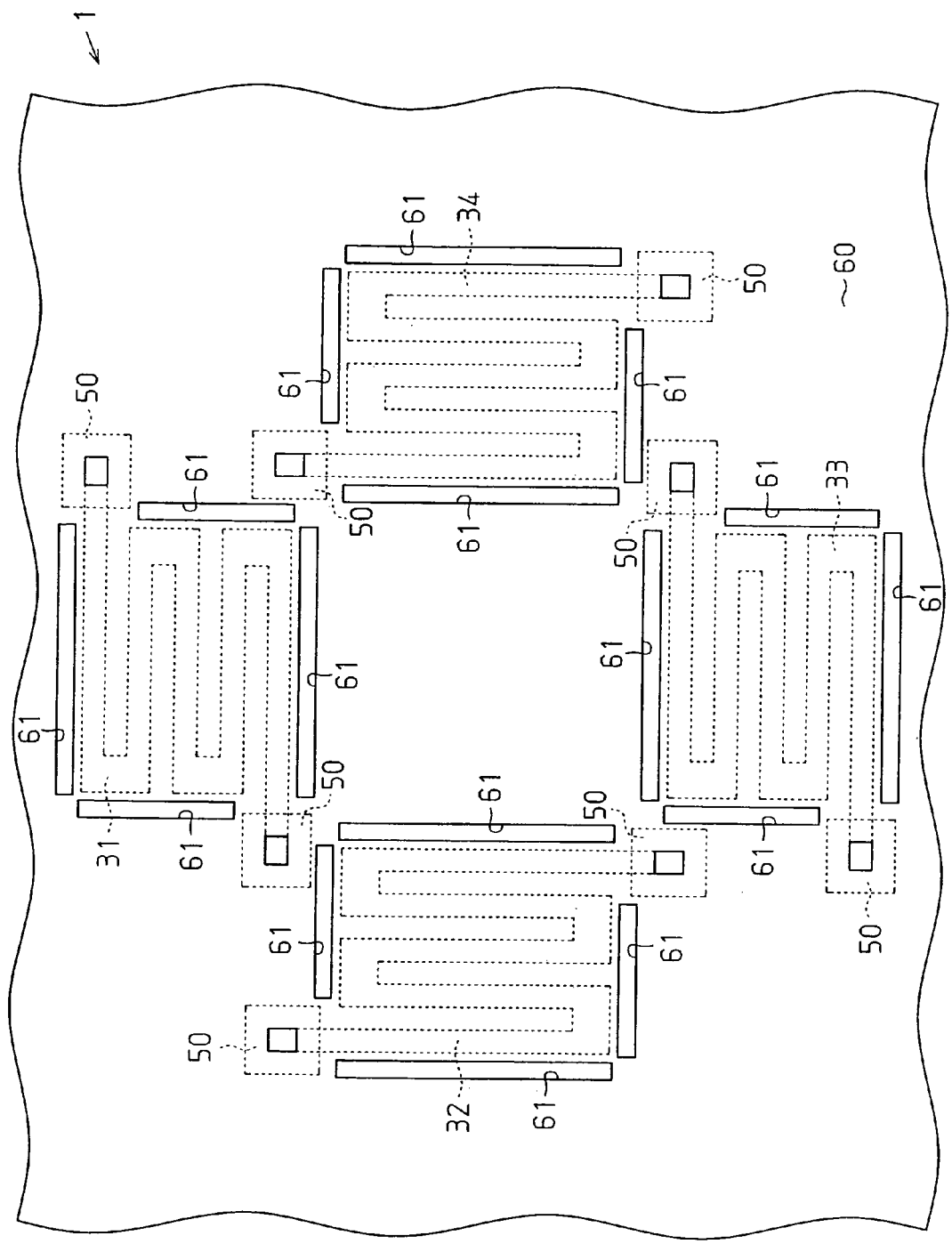
FIG. 1 is a plan view showing a magnetic sensor according to a first embodiment of the present invention.
Figure 2:
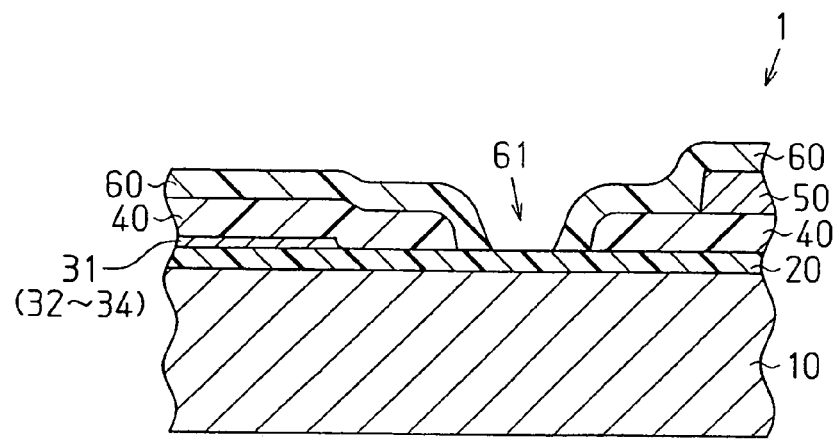
FIG. 2 is a partial cross-sectional diagram of the magnetic sensor shown in FIG. 1.

Referring to FIGS. 1 and 2, the magnetic sensor 1 includes a substrate 10. The substrate 10, which is formed by a semiconductor (silicon in the preferred embodiment), has an upper surface coated by an insulative film 20. The insulative film 20, which is formed by an oxide film (a film of silicon dioxide in the preferred embodiment), covers substantially the entire upper surface of the substrate 10. Magnetoresistance elements 31 to 34 are arranged on the insulative film 20. The magnetoresistance elements 31 to 34 are each formed by a thin film having a predetermined pattern. Further, the magnetoresistance elements 31 to 34 are made of a nickel-cobalt, which is a ferromagnet having a negative magnetic property.

An interlayer insulative film 40 is applied to the upper surface of the insulative film 20. The interlayer insulative film 40 covers most of the upper surface of the insulative film 20 and entirely covers the magnetoresistance elements 31 to 34. Further, the interlayer insulative film 40 is made of a nitride film (a film of silicon nitride in the preferred embodiment). Metal pads 50 are arranged on the upper surface of the interlayer insulative film 40. The magnetoresistance elements 31 to 34 each have an initiating end and a terminating end, which are each connected to the lower surface of one of the metal pads 50. Each metal pad 50 has a partially exposed upper surface. The metal pads 50 are formed from aluminum.

A passivation film is applied to the interlayer insulative film 40. The passivation film 60 covers most of the upper surface of the interlayer insulative film 40. The passivation film 60 is formed by a nitride film (a film of silicon nitride in the preferred embodiment).

The functions of the substrate 10, the insulative film 20, the magnetoresistance elements 31 to 34, the interlayer insulative film 40, the metal pads 50, and the passivation film 60 will now be discussed.

Figure 3:
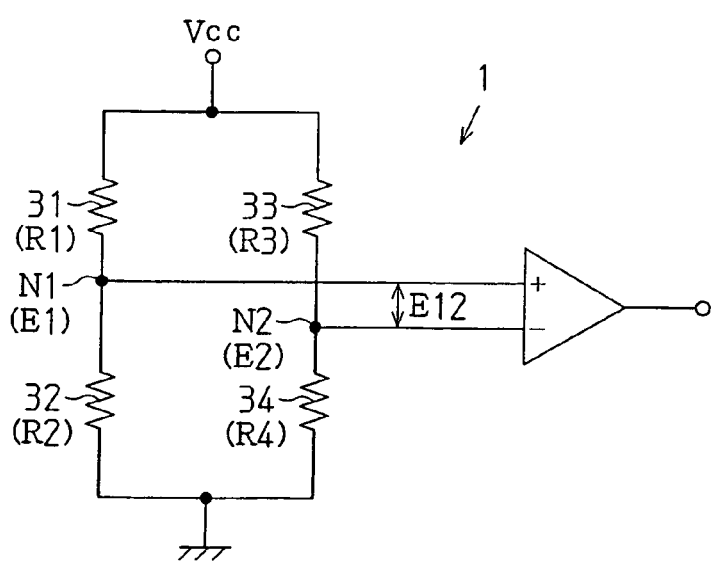
FIG. 3 is an electrical circuit diagram of a magnetic sensor.

The substrate 10 functions as a base for the magnetoresistance elements 31 to 34. The insulative film 20 functions to ensure the necessary level of insulation between the substrate 10 and the magnetoresistance elements 31 to 34. In other words, the insulative film 20 functions as an underlayer when arranging the magnetoresistance elements 31 to 34 on the substrate 10. The magnetoresistance elements 31 to 34 function as sensor elements of the magnetic sensor 1 for detecting magnetism changes. The magnetoresistance elements 31 to 34 have electrical resistances R1 to R4 that change in accordance with magnetism changes. The interlayer insulative film 40 functions as a protective film for protecting the magnetoresistance elements 31 to 34 from external disturbances. The metal pads 50 function as a medium for electrically connecting the magnetoresistance elements 31 to 34 with a wire bonding in the state shown in FIG. 3. The passivation film 60 functions as a protective film for protecting the magnetoresistance elements 31 to 34 from external disturbances.

The features of the magnetic sensor 1 will now be described.

The interlayer insulative film 40 and the passivation film 60 form a protective film that covers the magnetoresistance elements 31 to 34. The protective film (interlayer insulative film 40 and passivation film 60) include etched portions, or recesses 61. Each recess 61, which is formed by etching and eliminating parts of the protective film, extends to the insulative film 20. The recesses 61 are arranged so that they do not expose the magnetoresistance elements 31 to 34. Thus, the magnetoresistance elements 31 to 34 are each entirely covered by the protective film. The recesses 61 are arranged to surround each of the magnetoresistance elements 31 to 34, which are polygonal. When the magnetoresistance elements 31 to 34 are each rectangular, four of the recesses 61 are arranged, independent from one another, along the four sides of each of the rectangular magnetoresistance elements 31 to 34.

The advantages of the above embodiment will now be discussed.

(1) The protective film (interlayer insulative film 40 and passivation film 60), which cover the magnetoresistance elements 31 to 34, are etched and partially eliminated. This reduces the stress applied to the magnetoresistance elements 31 to 34 by the protective film (interlayer insulative film 40 and passivation film 60). Further, this suppresses changes in the electrical resistances R1 to R4 that would occur due to the stress that causes wear in the magnetoresistance elements 31 to 34. In other words, changes in the offset voltage 12 resulting from wear are suppressed. Additionally, the etching performed to eliminate parts of the protective film (interlayer insulative film 40 and passivation film 60) does not require a device for emitting a laser beam. This lowers the manufacturing costs. Accordingly, the magnetic sensor 1 is inexpensive and prevents changes in the offset voltage V12 that would be caused by wear.

(2) The protective film (interlayer insulative film 40 and passivation film 60) are partially eliminated so that the magnetoresistance elements 31 to 34 are not exposed. That is, the magnetoresistance elements 31 to 34 are each maintained in a state protected by the protective film (interlayer insulative film 40 and passivation film 60). If the magnetoresistance elements 31 to 34 were not protected by the protective film (interlayer insulative film 40 and passivation film 60), external disturbances would cause wear that change the electrical resistances. However, this does not occur in the above embodiment. Accordingly, the full capacity of the magnetic sensor 1 may be utilized.

(3) The protective film (interlayer insulative film 40 and passivation film 60) are eliminated along the surrounding of each of the magnetoresistance elements 31 to 34. This optimally mitigates the stress applied to the magnetoresistance elements 31 to 34 by the protective film (interlayer insulative film 40 and passivation film 60). Accordingly, changes in the electrical resistances R1 to R4 caused by stress are suppressed in an optimal manner.

(4) Parts of the protective film (interlayer insulative film 40 and passivation film 60) are eliminated through etching to form the recesses 61, which extend to the insulative film 20, in the protective film (interlayer insulative film 40 and passivation film 60). This ensures mitigation of the stress applied to the magnetoresistance elements 31 to 34 by the protective film (interlayer insulative film 40 and passivation film 60). Accordingly, changes in the electrical resistances R1 to R4 caused by stress are suppressed.

It should be apparent to those skilled in the art that the present invention may be embodied in many other specific forms without departing from the spirit or scope of the invention. Particularly, it should be understood that the present invention may be embodied in the following forms.

Figure 4:
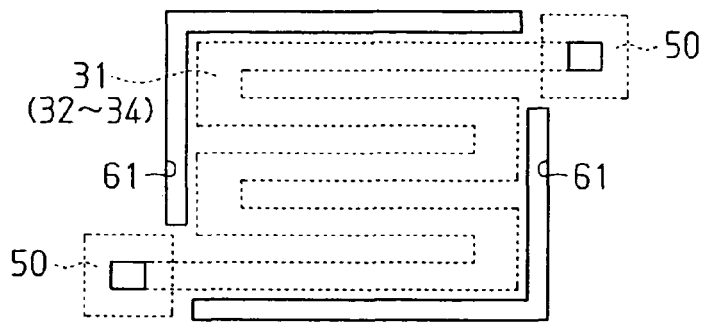
FIG. 4 is a schematic plan view of a magnetic sensor according to a second embodiment of the present invention.

Referring to FIG. 4, when the magnetoresistance elements 31 to 34 each have a rectangular outer shape, a recess 61 may be arranged so as to extend along two sides of each of the magnetoresistance elements 31 to 34. In this case, two independent L-shaped recesses 61 are provided for each of the magnetoresistance elements 31 to 34.

Figure 5:
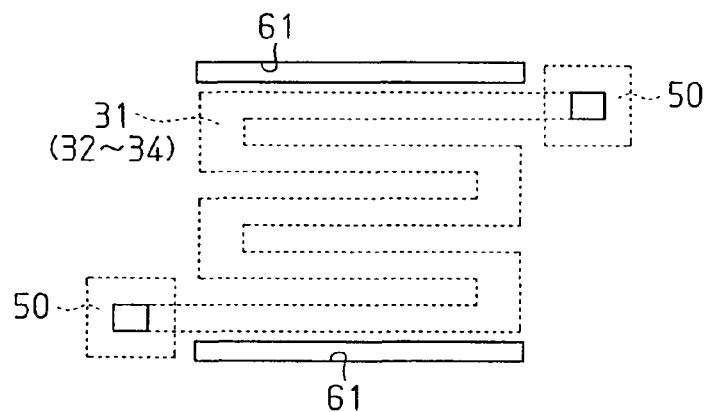
FIG. 5 is a schematic plan view of a magnetic sensor according to a third embodiment of the present invention.

Referring to FIG. 5, when the magnetoresistance elements 31 to 34 each have a rectangular outer shape, two independent recesses 61 may be formed along two sides (e.g., the two long sides) of each of the magnetoresistance elements 31 to 34.

Figure 6:
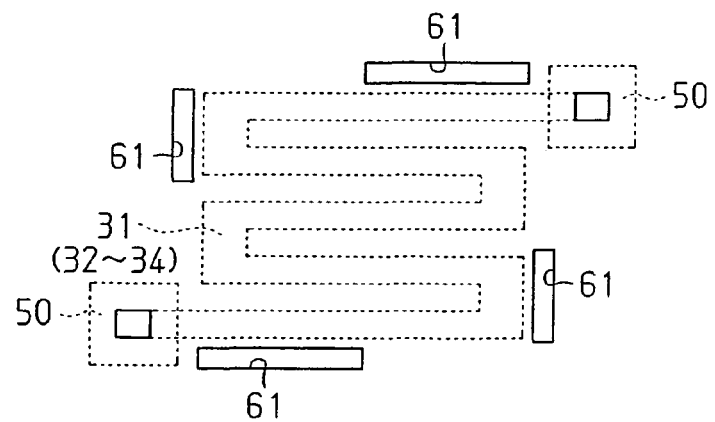
FIG. 6 is a schematic plan view of a magnetic sensor according to a fourth embodiment of the present invention.

Referring to FIG. 6, when the magnetoresistance elements 31 to 34 each have a rectangular outer shape, four independent short recesses 61 may be formed along the four sides of each of the magnetoresistance elements 31 to 34.

The recesses 61 may have any shape.

It is preferred that the recesses 61 are arranged in a balanced manner.

Figure 7:
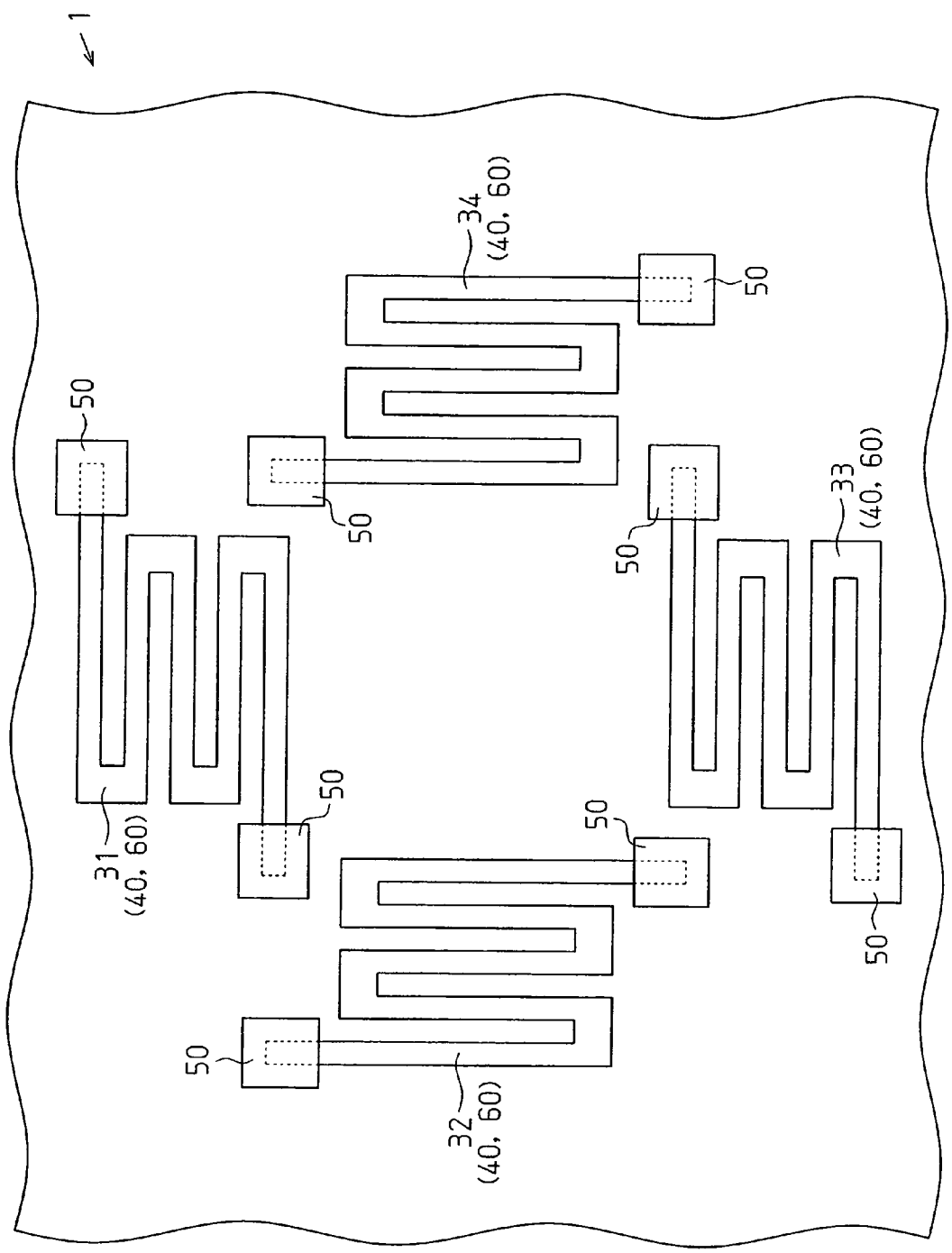
FIG. 7 is a schematic plan view of a magnetic sensor according to a fifth embodiment of the present invention.
Figure 8:
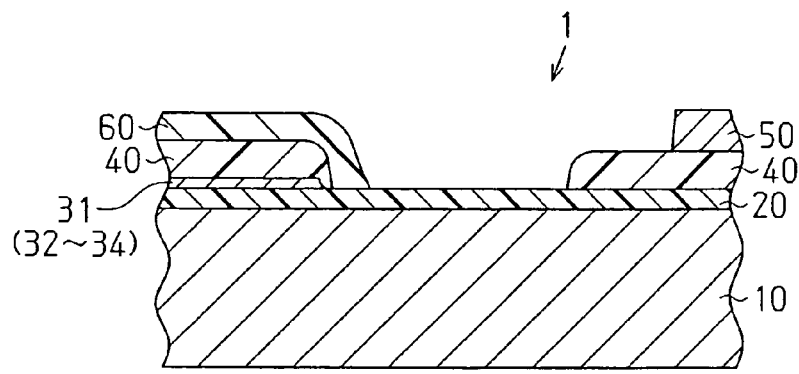
FIG. 8 is a cross-sectional diagram of the magnetic sensor shown in FIG. 7.

Referring to FIGS. 7 and 8, excluding portions overlapping the magnetoresistance elements 31 to 34, the protective film (interlayer insulative film 40 and passivation film 60) may be completely etched and eliminated. This ensures mitigation of the stress applied to the magnetoresistance elements 31 to 34 by the protective film (interlayer insulative film 40 and passivation film 60). Accordingly, changes in the electrical resistances R1 to R4 resulting from such stress are suppressed.

Figure 9:
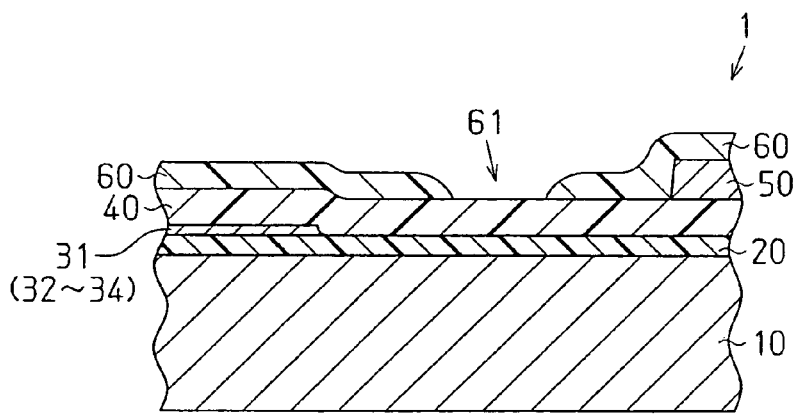
FIG. 9 is a cross-sectional diagram of a magnetic sensor according to a sixth embodiment of the present invention.

Referring to FIG. 9, the etching may be performed so that only part of the passivation film 60 is eliminated. In this case, the interlayer insulative film 40 does not undergo etching. If the magnetoresistance elements 31 to 34 are each covered by three or more layers of protective film, the etching may be performed so as to eliminate part of at least one layer of the protective film.

Figure 10:
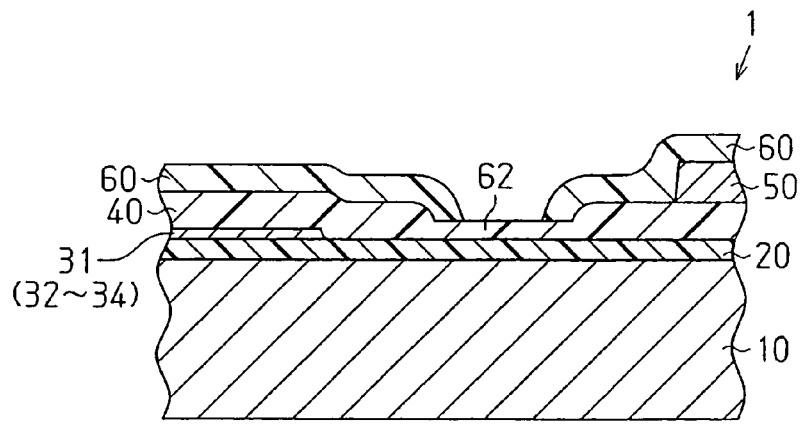
FIG. 10 is a cross-sectional diagram of a magnetic sensor according to a seventh embodiment of the present invention.

Referring to FIG. 10, part of the protective film (interlayer insulative film 40 and passivation film 60) may be etched and eliminated so as to form a thin portion 62 in the protective film. In other words, the etching may be performed to a depth that does not reach the insulative film 20. This optimally mitigates the stress applied to the magnetoresistance elements 31 to 34 by the protective film (interlayer insulative film 40 and passivation film 60). Accordingly, changes in the electrical resistances R1 to R4 resulting from such a stress are suppressed.

The magnetoresistance elements 31 to 34 do not have to be formed from a nickel-cobalt alloy. For example, the magnetoresistance elements 31 to 34 may be formed from a ferromagnet having a negative magnetic property, such as a permalloy.

The magnetoresistance elements 31 to 34 do not necessarily have to be formed from a material having a negative magnetic property. For example, the magnetoresistance elements 31 to 34 may be formed of a semiconductor having a positive magnetic property, such as indium antimonide and gallium arsenide.

The insulative film 20 may be a nitride film (e.g., silicon nitride).

The interlayer insulative film 40 may be an oxide film (e.g., silicon dioxide).

The interlayer insulative film 40 and the passivation film 60 may be formed of different materials. For example, the interlayer insulative film 40 may be a nitride film and the passivation film 60 may be an oxide film.

The present invention is embodied in a sensor for detecting magnetism changes. For example, the present invention may be applied to sensors for detecting a change in a physical property, such as light, heat, and pressure.

The present examples and embodiments are to be considered as illustrative and not restrictive, and the invention is not to be limited to the details given herein, but may be modified within the scope and equivalence of the appended claims.

What is claimed is:

1. A sensor for detecting a change in a physical property, the sensor comprising:
    a plurality of sensor elements, each having an electrical resistance that varies in accordance with a change in a physical property;
    a protective film for covering the sensor elements; and
    an etched portion formed in at least part of the protective film without exposing the sensor elements from the protective film, wherein the etched portion is a recess extending along the periphery of each of the sensor elements, the recess being formed in portions of the protective film excluding portions overlapped with the sensor elements.

2. The sensor according to claim 1, wherein the recess forms a thin portion in the protective film.

3. The sensor according to claim 1, wherein the sensor elements are each polygonal and have a plurality of sides, and the recess is formed in correspondence with each of at least two of the sides of each sensor element.

4. The sensor according to claim 1, wherein the protective film includes a passivation film and an interlayer insulative film, and the recess is formed in at least part of the passivation film without exposing the sensor elements to the passivation film.

5. The sensor according to claim 1, further comprising:
    an insulative film on which the sensor elements are formed, wherein the recess is formed in the protective film so as to extend to the insulative film.

6. A magnetic sensor for detecting rotational angle of a steering wheel, the magnetic sensor comprising:
    a substrate;
    an insulative film formed on the substrate;
    a plurality of sensor elements formed on the insulative film, with each of the sensor elements having an electrical resistance that varies in accordance with a magnetism change and being rectangular and having four sides;
    a protective film for covering the sensor elements; and
    a recess formed in the protective film near each of the sensor elements without exposing the sensor elements from the protective film, wherein the recess is a thin portion formed in portions of the protective film excluding portions overlapped with the sensor elements, and the recess is formed in correspondence with each of at least two of the sides of each sensor element.

7. The magnetic sensor according to claim 6, wherein the recess is formed along the periphery of each of the sensor elements by an etched portion in the protective film.

8. The magnetic sensor according to claim 6, wherein the protective film includes a passivation film and an interlayer insulative film, and the thin portion is formed by etching at least part of the passivation film without exposing the sensor elements to the passivation film.

9. The magnetic sensor according to claim 6, wherein the recess is formed in the protective film so as to extend to the insulative film.

10. The sensor according to claim 1, wherein the sensor elements are each tetragonal and have four sides, and the recess is formed along each of the four sides of each sensor element.

11. The sensor according to claim 1, wherein the sensor elements are each tetragonal and have four sides, and the recess is one of two L-shaped recesses, each formed along a pair of adjacent sides of each sensor element.

12. The sensor according to claim 1, wherein the sensor elements are each tetragonal and have four sides, and the recess is formed along the entire length of at least one of the four sides of each sensor element.

13. The sensor according to claim 1, wherein the recess is one of a plurality of recesses that are arranged in a balanced manner so as the reduce stress applied by the protective layer to each sensor element.

* * * * *